(12) United States Patent
Soubh et al.

(10) Patent No.: US 7,549,884 B2
(45) Date of Patent: Jun. 23, 2009

(54) PROBE HAVING A FIELD-REPLACEABLE TIP

(75) Inventors: Emad Soubh, Camas, WA (US); Doug McCartin, Henryville, IN (US); Jeremy Wooldridge, Shepherdsville, KY (US); Steve Koopman, Floyds Knobs, IN (US)

(73) Assignee: Samtec, Inc., New Albany, IN (US)

( * ) Notice: Subject to any disclaimer, the term of this patent is extended or adjusted under 35 U.S.C. 154(b) by 0 days.

(21) Appl. No.: 11/668,455

(22) Filed: Jan. 29, 2007

(65) Prior Publication Data

US 2008/0180122 A1   Jul. 31, 2008

(51) Int. Cl.
*H01R 27/00* (2006.01)
(52) U.S. Cl. ........................................ 439/289; 439/498
(58) Field of Classification Search .................. 439/289, 439/638, 141, 140, 498
See application file for complete search history.

(56) References Cited

U.S. PATENT DOCUMENTS

| | | | | |
|---|---|---|---|---|
| 4,885,533 A | * | 12/1989 | Coe | 324/754 |
| 5,924,879 A | * | 7/1999 | Kameyama | 439/141 |
| 6,290,532 B1 | * | 9/2001 | Vermeersch et al. | 439/460 |
| 6,466,000 B1 | * | 10/2002 | Nightingale | 324/72.5 |

* cited by examiner

*Primary Examiner*—Phuong K Dinh
(74) *Attorney, Agent, or Firm*—Keating & Bennett, LLP

(57) ABSTRACT

A probe is provided for testing the electrical characteristics of a device. The probe includes a housing, a plurality of cables, a circuit board located within the housing, and a field-replaceable probe tip. The probe tip includes an array of contacts. Each of the plurality of cables is connected to a corresponding contact. The probe includes a retractable shroud that retracts as the probe is connected to the device. The contacts have bifurcated tips.

15 Claims, 15 Drawing Sheets

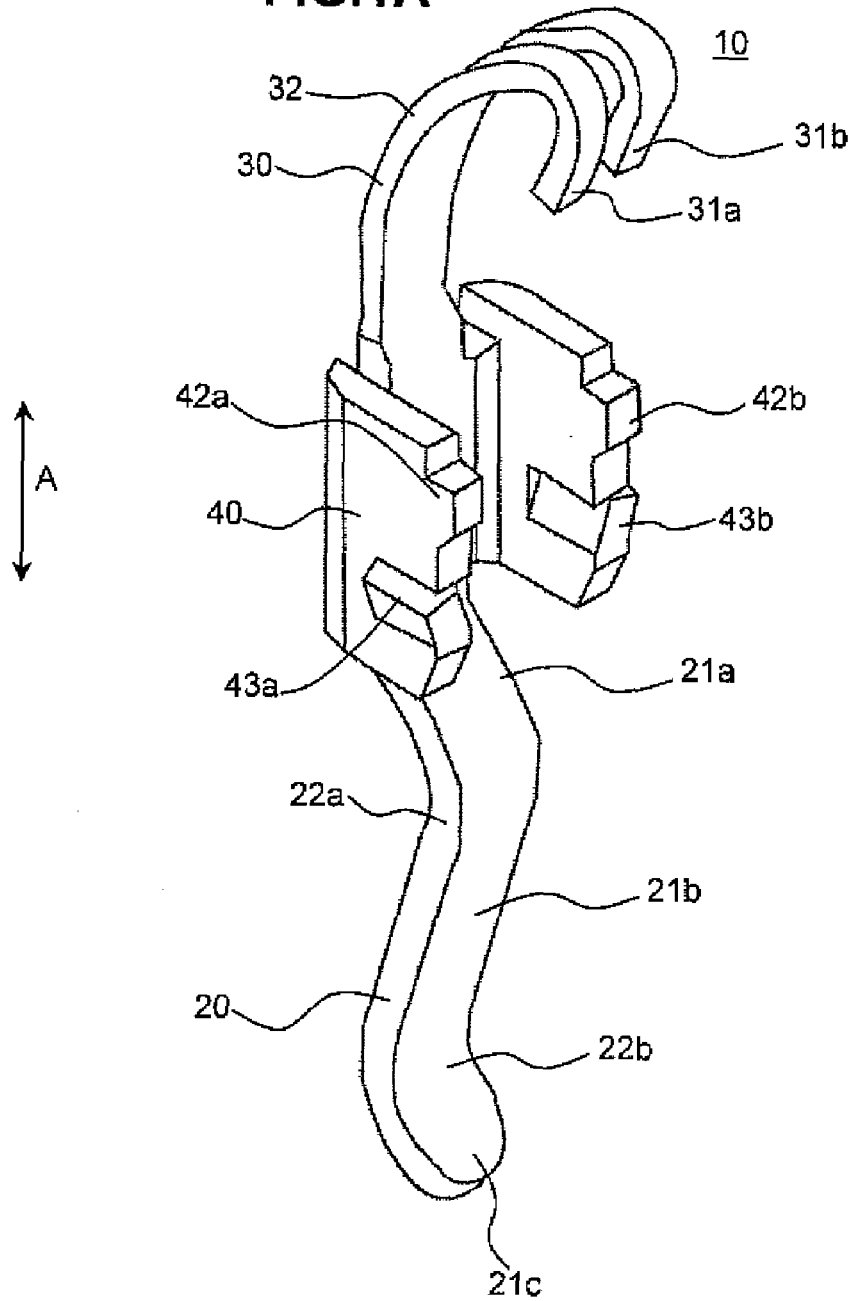

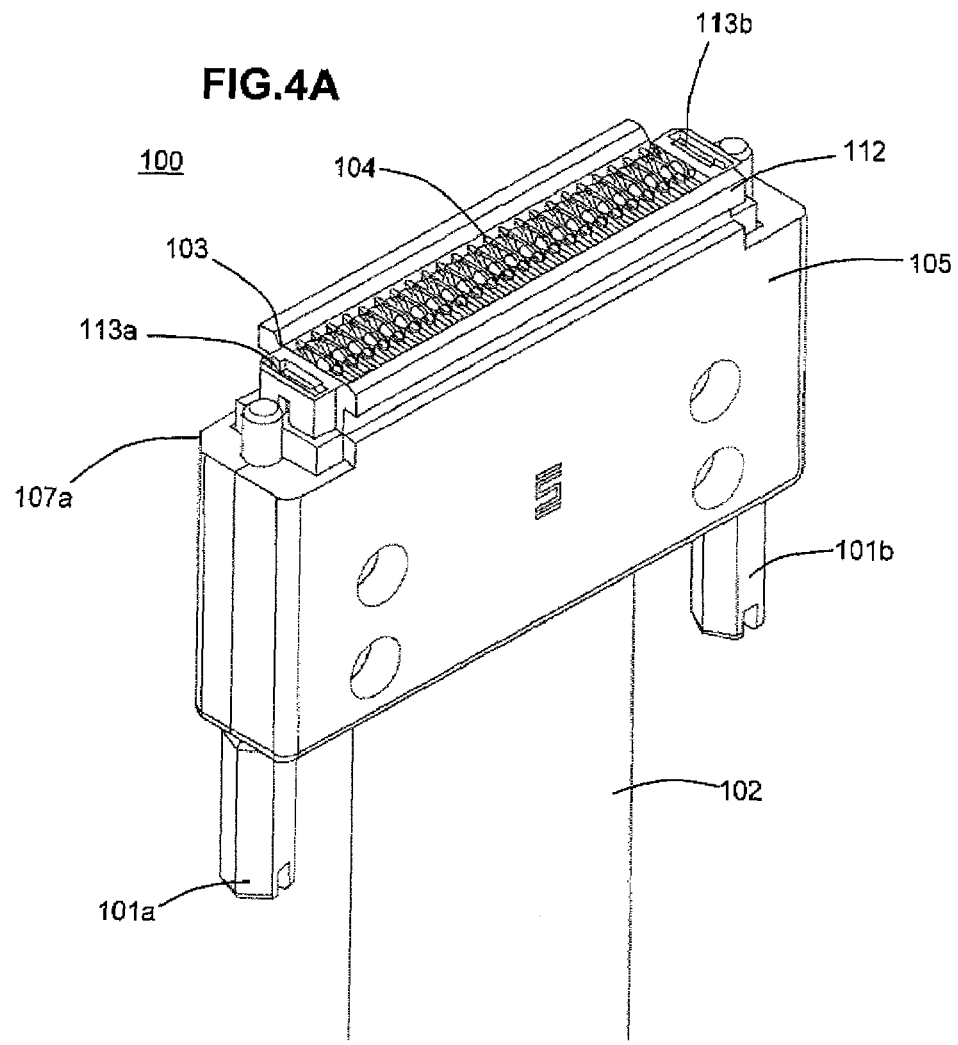

PROBE HAVING A FIELD-REPLACEABLE TIP

BACKGROUND OF THE INVENTION

1. Field of the Invention

The present invention relates to probes for testing electrical properties of devices. More specifically, the present invention relates to probes having field-replaceable tips.

2. Description of the Related Art

It is known in the field of high-speed, multi-channel protocol analysis to use a probe to test a device's electrical properties. The device being tested is known as a DUT (Device Under Testing). For example, a probe can be placed in parallel with the conductors transmitting the electrical signals to be tested. With this arrangement, the electrical characteristics of the DUT can be tested when the DUT is operating.

Known probe assemblies have the same basic arrangement including a DUT connected to testing equipment by a probe. The end of the probe that is to be connected to the DUT includes a connector that has a transition circuit board connected to cables. This circuit board includes a passive component, e.g., a resistor, a capacitor, etc., or a combination of passive components as needed. This use of passive components is discussed below. The cable is typically either a 50 Ω or a 75 Ω coaxial cable. The end of the probe that is to be connected to the testing equipment also includes a transition circuit board connected to the cables, where different connectors are required for different test equipment.

Specific examples of connectors used in known probes include Tyco's Mictor™ connector, Samtec's BTH and BSH connectors, and Agilent's SoftTouch™ connectors.

The probes of these known probe assemblies suffer from one or more of the following problems. A first problem is that the known probes have an effective electrical stub length that is too long. The electrical stub length of the probe is the length of the conductor in the probe through which the electrical signals from the DUT are transmitted. The physical arrangement of the conductor, especially the contact, affects the electrical signals from the DUT because of the capacitance, inductance, and resistance created by the physical arrangement of the conductor. The total disturbance of the electrical signals transmitted in the DUT caused by the electrical stub length of the probe and the physical arrangement of the conductor in the probe can be quantified as the effective electrical stub length of the probe. It is desirable to have the shortest possible effective electrical stub length to minimize the disturbance to the signal being transmitted in the DUT. In the past, it was known to shrink the physical size of the contacts, which resulted in the electrical stub length being smaller. However, the effective electrical stub length was increased because of the physical arrangement of the contact.

To decrease the electrical stub length of the probe, a method is known to provide a passive component, typically a resistor, in the path of the conductor of the probe. The passive component or combination of passive components prevents or dramatically decreases the leakage current to the probe, which allows the signals being transmitted in the DUT to be measured with minimal disturbance to these signals. However, the shortening of the electrical stub length is limited in this method by the physical arrangement of the contact. As the frequency used in devices increases, it is important to use arrangements of the probe that have smaller and smaller electrical stub lengths.

The Tyco Mictor™ connector has an effective electrical stub length of about 0.240 inches. Samtec BTH and BSH connectors have an effective electrical stub length of about 0.200 inches. The Agilent SoftTouch™ connector has an effective electrical stub length of about 0.130 inches.

A second problem is that the known probes (including the Tyco Mictor™ connector, the Samtec BTH and BSH connectors, and the Agilent SoftTouch™ connector) have a tip connector that is not field-replaceable. Because the tip is not field-replaceable, the entire probe must be sent back to the manufacturer to replace the probe tip and to calibrate the probe assembly when the tip is defective, damaged, or malfunctioning. To replace the probe tip, the probe tip must be either desoldered or cut. This is a costly and time-consuming process.

A third problem is that it is difficult to ensure the proper alignment of the known probe with the DUT. Some known probes (e.g., the Tyco Mictor™ connector and the Samtec BTH and BSH connectors) require that a connector be placed on the DUT that receives the probe. The connector increases the cost and complexity of manufacturing the DUT and increases the electrical stub length of the DUT. Some known probes (e.g., the Agilent SoftTouch™ connector) use a connector-less arrangement that includes a one-piece shroud that surrounds the entire area of the DUT with which the probe engages during the testing of the DUT. The one-piece shroud occupies a large amount of space on the surface of the DUT and must be attached to the DUT by hand.

A fourth problem with the known probes (including the Tyco Mictor™ connector, the Samtec BTH and BSH connectors, and the Agilent SoftTouch™ connector) is that they do not provide sufficient protection for the probe tip. Because the tip of the known probes does not retract, the tips are easily damaged. Typically, probe caps are provided to protect the tips. However, these caps are easily lost because they must be removed when the probe is used for testing.

A fifth problem with the known probes, e.g., including the Agilent SoftTouch™ connector, is that some of the known probes use spring pins. Spring pins include a socket, a pin that is partially disposed in the socket, and a spring disposed in the socket that pushes the pin away from the socket. This arrangement of spring pins allows the pins to travel within the socket. Because of their non-unitary construction, spring pins are difficult and time consuming to manufacture compared to contacts having a unitary construction. Because of this, spring pins are extremely expensive, for example, ten to twenty times the price of contacts having unitary construction.

SUMMARY OF THE INVENTION

To overcome the problems described above, preferred embodiments of the present invention provide a probe having a field-replaceable probe tip.

A probe for testing the electrical characteristics of a device to be tested according to a preferred embodiment of the present invention includes a housing, a plurality of cables, a circuit board located within the housing, and a field-replaceable probe tip having a plurality of contacts. Each of the plurality of cables is connected to a corresponding one of the plurality of contacts.

The probe preferably includes a retractable shroud that retracts as the probe is connected to the device to be tested. At least one of the plurality of contacts preferably has a bifurcated tip. At least one of the plurality of contacts preferably includes a finger portion, a retention portion, and a curl portion. The finger portion of the at least one of the plurality of contacts is preferably arranged to contact a corresponding electrical land on the circuit board. The curl portion of the at least one of the plurality of contacts is preferably arranged to contact a corresponding electrical land on the device to be tested.

Preferably, the plurality of contacts of the probe are arranged such that the probe tip includes a compression connector for engaging the device to be tested. Preferably, the plurality of contacts of the probe are arranged such that the probe tip includes an edgemount connector that is field-replaceable with the circuit board.

Some of the contacts of the probe are preferably connected to a ground plane. At least some of the plurality of cables are preferably grouped in pairs of cables that transmit differential signals. The effective electrical stub length of the probe is preferably about 0.100 inches to about 0.110 inches.

Preferably, the housing of the probe includes at least one corner that is arranged such that the proper orientation of the probe with respect to the device being tested is ensured when the device to be tested is tested. Preferably, the field-replaceable probe tip includes a pair of slots and a pair of notches, and the pair of slots and the pair of notches are arranged such that a tool can be used to remove the field-replaceable probe tip from the probe by being inserted into the pair of slots and by engaging the pair of notches when the tool is pulled away from the probe.

At least one spring in the housing preferably pushes a retractable shroud away from the probe to protect the probe tip when the probe is not testing the device to be tested.

An alignment assembly for aligning a probe with respect to a device according to a preferred embodiment of the present invention to be tested includes a first alignment block, a second alignment block, and an alignment piece connecting the first alignment block and the second alignment block. The first alignment block and the second alignment block are preferably used to align the probe with respect to the device to be tested.

The alignment piece is preferably removable from the first alignment block and the second alignment block. The alignment assembly is preferably arranged such that the proper orientation of the alignment assembly is ensured when the alignment assembly is attached to the device to be tested. The alignment assembly preferably includes alignment pegs that correspond to alignment holes in the device to be tested and that are arranged to ensure proper orientation of the alignment assembly. The first alignment block and the second alignment block preferably each include a ledge.

A probe assembly includes a probe according to a preferred embodiment of the present invention and a device to be tested.

Other features, elements, characteristics and advantages of the present invention will become more apparent from the following detailed description of preferred embodiments of the present invention with reference to the attached drawings.

BRIEF DESCRIPTION OF THE DRAWINGS

FIG. 1A is a perspective view of a contact according to a preferred embodiment of the present invention.

FIGS. 4A and 4B are perspective views of a probe according to a preferred embodiment of the present invention.

DETAILED DESCRIPTION OF PREFERRED EMBODIMENTS

Figure 1B:
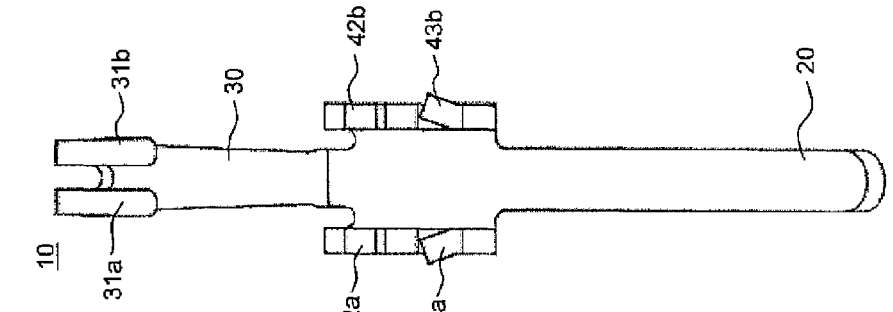
FIGS. 1B, 1C, and 1D are rear, side, and front views, respectively, of a contact according to a preferred embodiment of the present invention.
Figure 1C:
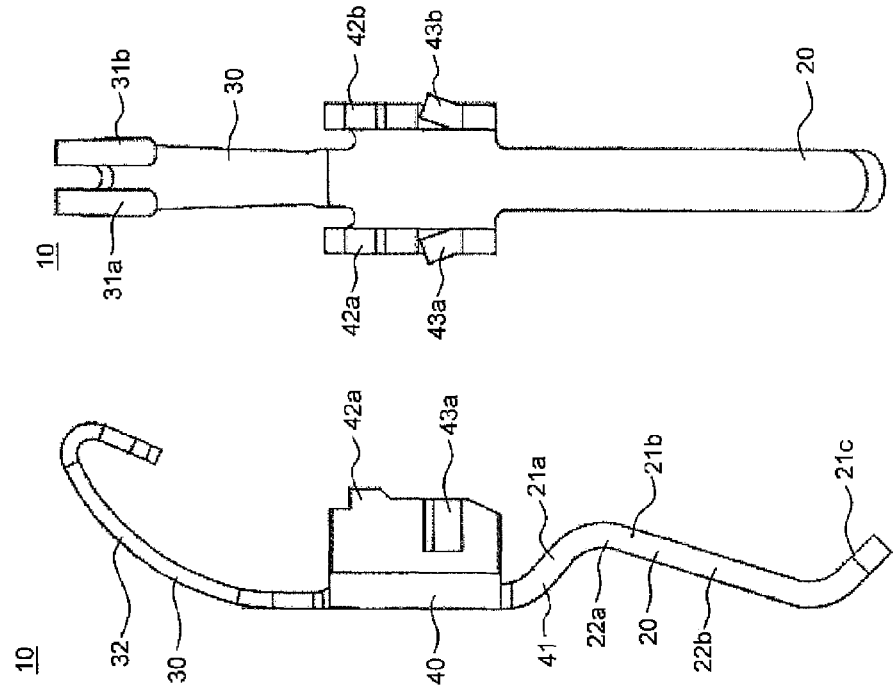
Figure 1D:
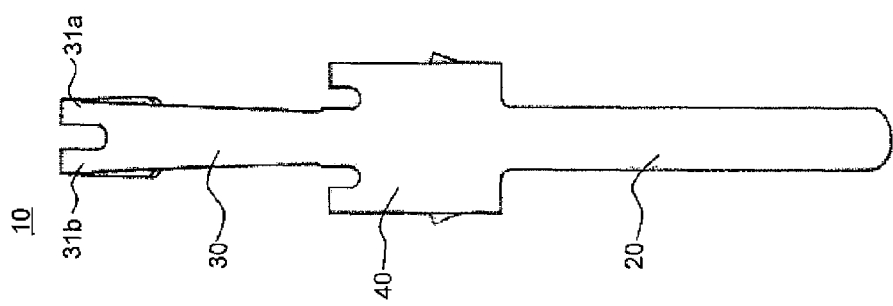

The preferred embodiments of the present invention are discussed below with respect to the figures. First, a contact according to a preferred embodiment of the present invention that is used in a probe assembly according to a preferred embodiment of the present invention is discussed. Second, the alignment assembly according to a preferred embodiment of the present invention is discussed. Third, the probe assembly according to a preferred embodiment of the present invention is discussed.

Contact for Use in a Probe Assembly

FIGS. 1A-1D and 2 show a contact 10 according to a preferred embodiment of the present invention. Contact 10 includes a finger portion 20, a curl portion 30, and a retention portion 40. The finger portion 20 is connected to one end of the retention portion 40, and the curl portion 30 is attached to the other end of the retention portion 40. Preferably, the contact 10 is of unitary construction. The contact 10 is preferably formed of a copper alloy, such as beryllium copper or phosphor bronze, or other suitable conductive material.

The finger portion 20 of the contact is used to make contact with an electrical land 51 on a circuit board 50. The finger portion 20 is arranged such that, when the finger portion 20 is in contact with the electrical land 51 of the circuit board 50, the major surfaces 50a and 50b of the circuit board 50 are generally parallel to direction A, which extends in the length direction of the contact 10. Typically, two rows of contacts 10 are arranged in opposing positions such that, when a circuit board 50 is inserted between the two rows of contacts 10, the finger portions 20 of the contacts 10 make contact with the corresponding electrical lands 51 on both major surfaces 50a and 50b of the circuit board 50.

Preferably, finger portions 20 include three straight portions 21a, 21b, and 21c that are connected by two bent portions 22a and 22b. Straight portion 21a is connected to straight portion 21b by bent portion 22a, and straight portion 21b is connected to straight portion 21c by bent portion 22b.

Finger portion 20 is connected to the retention portion 40 by bent portion 41. Bent portion 41 and bent portion 22a are arranged such that the finger portion 20 acts as a spring whose force is acting in a direction towards the circuit board 50. Bent portion 22b is the portion of the finger portion 20 that makes direct contact with a corresponding electrical land 51 on the circuit board 50. Contact between the bent portion 22b and electrical land 51 is consistently and reliably maintained because of the spring action caused by the arrangement of the bent portion 41 and the bent portion 22a. When the contacts 10 are arranged in two opposing rows, the opposing straight portions 21c of the two rows of contacts 10 guide the circuit board 50 in between the fingers 20 of the contacts 10.

The curl portion 30 of the contact 10 is used to make contact with an electrical land 61 on a circuit board 60. As opposed to the arrangement of the finger portion 20 of the contact 10 discussed above, the curl portion 30 is arranged such that, when the curl portion 30 is in contact with the electrical land 61 of the circuit board 60, the major surfaces 60a and 60b of the circuit board 60 are generally perpendicular to the direction A. Typically, the contacts 10 of a single connector are arranged such that all of the curl portions 30 of the contacts 10 make mechanical and electrical contact with the corresponding electrical lands 61 on the same surface of the circuit board 60. The curl portion 30 includes a curved portion 32. One end of the curved portion 32 is connected to the retention portion 40. The other end of the curl portion 30 of the contact 10 includes bifurcated tips 31a and 31b. The bifurcated tips 31a and 31b make contact with the electrical lands 61 of the circuit board 60. The bifurcated tips 31a and 31b provide redundant contact points for the current to flow from the electrical lands 61 to the contact 10, which improves the electrical properties, e.g., lowers the resistance, of the circuit that includes the contact 10. Further, the contact wipe (i.e., the removal of an oxide layer on the electrical lands 61 by the contacts) of the electrical land 61, when the bifurcated tips 31a and 31b come into contact with the electrical land 61, also improves the electrical properties of the circuit that includes the contact 10 by ensuring a reliable connection between the contact 10 and the electrical land 61 because it provides a larger and better wipe of the electrical lands 61. The bifurcated tips 31a and 31b also provide an electrical connection to the circuit board 60 even if one of the bifurcated tips 31a or 31b is not connected.

The retention portion 40 of the contact 10 includes several retention features for securing the contact 10 in the housing of a connector 70. The retention portion 40 includes blocks 42a and 42b and lances 43a and 43b, all of which are retention features. The blocks 42a and 42b and the lances 43a and 43b act in cooperation to secure the contact 10 in the housing of the connector 70. Blocks 42a and 42b oppose each other and secure the contact 10 in a first direction, and lances 43a and 43b oppose each other and secure the contact 10 in a second direction perpendicular or substantially perpendicular to the first direction. Lances 43a and 43b also secure the contact 10 from being pulled out of the connector housing.

Contact 10 can have a different arrangement of retention features or have different retention features than those described above. For example, the contact 10 could use (1) only blocks 42a and 42b; (2) only lances 43a and 43b; (3) one block 42a or 42b and one lance 43a or 43b; or (4) any other suitable arrangement. Also, instead of lances 43a and 43b, the contact 10 can have different retention features such as a hemispherical boss or other suitable retention features. The retention features of the contact 10 should be arranged such that the contact 10 is securely retained within the connector housing, including securing the contact 10 within the connector housing such that the contact 10 is allowed to float within the connector housing.

Figure 2:
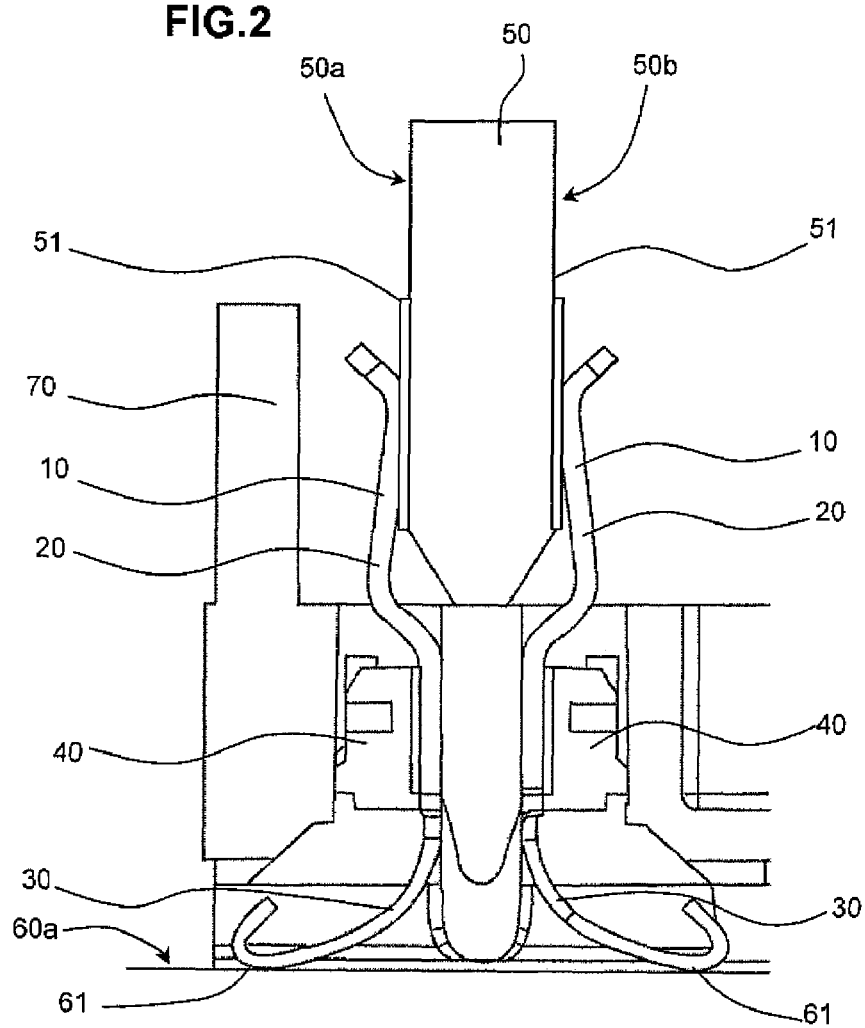
FIG. 2 is a close-up sectional view of a connector having a contact according to a preferred embodiment of the present invention in an electrical connector.
Figure 2:
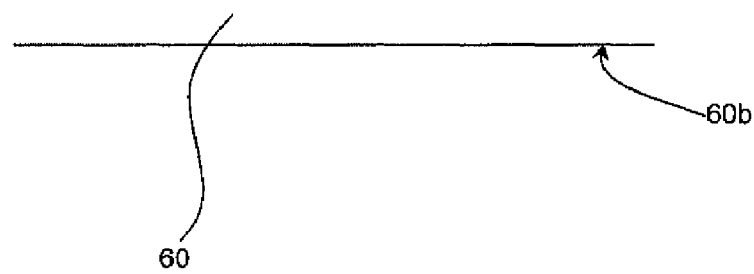

The arrangement of the contacts 10 in the connector 70 shown in FIG. 2 is illustrative of one arrangement of the contacts 10. Other arrangements of the contacts 10 in the connector 70 are also possible. For example, instead of two rows of contacts 10, the connector 70 could be arranged to have one row of contacts 10 or to have three or more rows of contacts 10.

Alignment Assembly for Probe Assembly

FIGS. 3A-3D show the alignment assembly 200 of a preferred embodiment of the present invention. Alignment assembly 200 includes alignment blocks 202a and 202b and alignment piece 203.

Figure 3A:
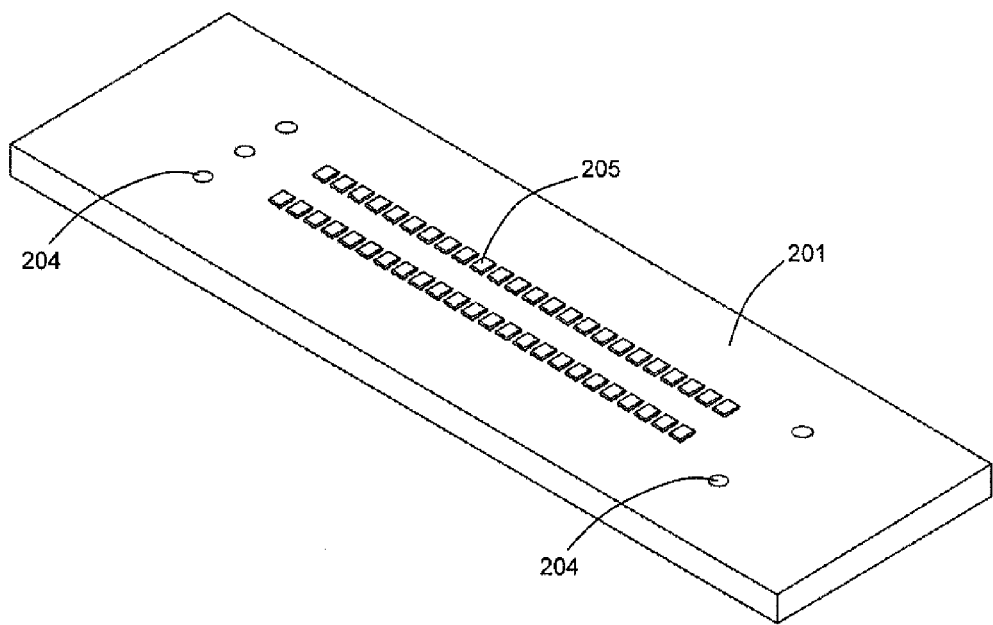
FIGS. 3A-3D are perspective views of a DUT and an alignment assembly according to a preferred embodiment of the present invention.

FIG. 3A shows the DUT 201 before the alignment assembly 200 is connected to the DUT 201. For the sake of clarity, the DUT 201 in FIG. 3A only shows the features used for aligning the alignment assembly 200 with respect to the DUT 201. Of course, the DUT 201 can have additional features. However, the features must be arranged such that the alignment assembly 200 can be attached to the DUT 201.

Figure 3B:
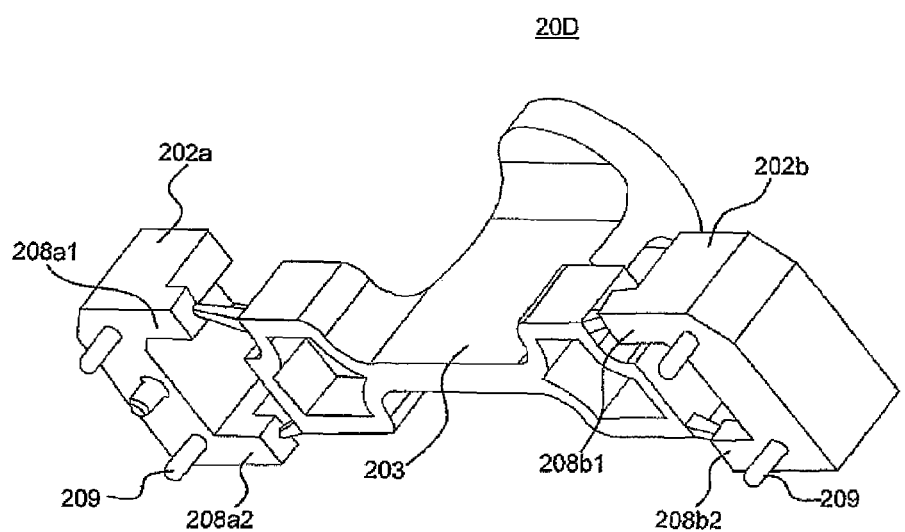

The DUT 201 includes alignment holes 204 provided at opposing ends of the array of electrical lands 205. As seen in FIG. 3B, the alignment assembly 200 includes alignment pegs 209 that correspond to the alignment holes 204. The alignment pegs 209 are inserted into the alignment holes 204 when attaching the alignment assembly 200 to the DUT 201. In order to ensure the proper orientation of the alignment assembly 200, three alignment holes 204 are provided at one end of the array of electrical lands 205, and two alignment holes 204 are provided at the other end of the array of electrical lands 205. Other arrangements of the alignment holes 204 could also be used. For example, instead of varying the number of alignments holes 204 to ensure proper orientation of the alignment assembly 200, the size or the shape, or both, of the alignment holes 204 could be varied. It is also possible to arrange the alignment holes 204 to be the same on both ends of the array of electrical lands 205 so that any orientation of the alignment assembly 200 can be used. However, additional steps would have to be taken if it is desired to ensure that the alignment assembly 200 is properly oriented. It is also possible to use other methods of ensuring that the alignment assembly 200 is properly oriented with respect to the DUT 201.

The array of electrical lands 205 shown in FIG. 3A is preferably arranged in two rows of electrical lands 205. However, other arrangements of the electrical lands are also possible. For example, instead of having two rows of electrical lands 205, the electrical lands 205 could be arranged in a single row or in three or more rows. The electrical lands 205 shown in FIG. 3A have a substantially rectangular shape. However, the electrical lands 205 could have any other suitable shape. It is also possible to provide traces on the DUT 201 that connect to the electrical lands 205 to provide more flexibility in routing the electrical lands 205 to the conductors transmitting the electrical signals in the DUT 201.

FIG. 3B shows the alignment assembly 200 according to a preferred embodiment of the present invention. The alignment assembly 200 includes alignment blocks 202a and 202b connected by an alignment piece 203. The bottom of alignment blocks 202a and 202b includes alignment pegs 209. The alignment piece 203 preferably includes a vacuum pick-up surface 210 that allows the attachment of the alignment assembly 200 to the DUT 201 to be automated. That is, the alignment assembly 200 can be picked up under vacuum and placed on the DUT 201 by a machine such that the alignment pegs 209 of the alignment assembly 200 are inserted into the alignment holes 204 of the DUT 201.

Figure 3C:
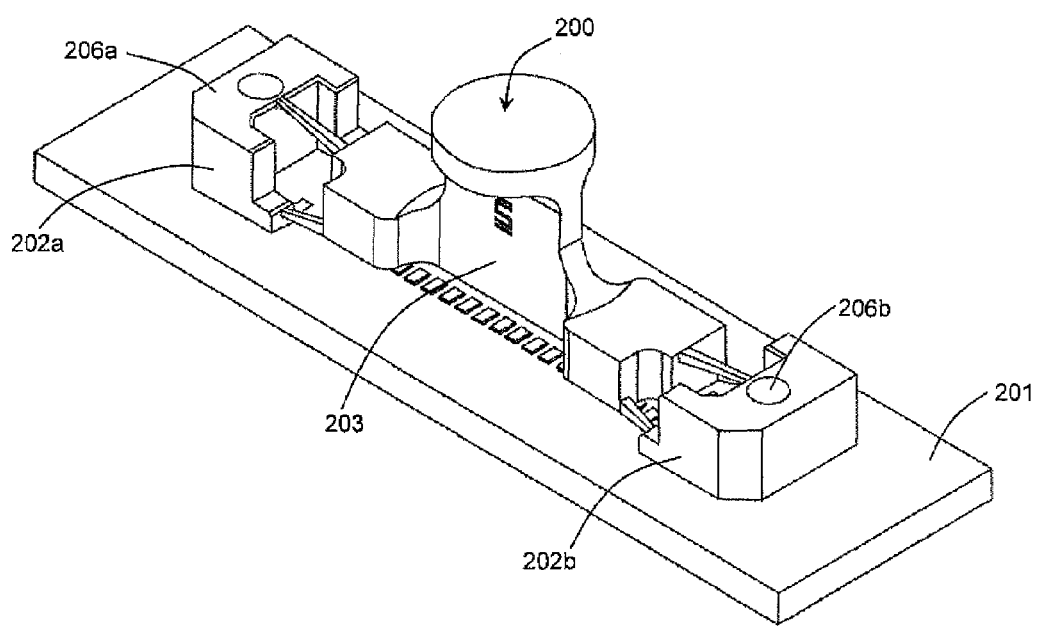

FIG. 3C shows the alignment assembly 200 attached to the DUT 201. As discussed above, the orientation of the alignment assembly 200 with respect to the DUT 201 is ensured because of the arrangement of the alignment holes 204 (not shown in FIG. 3C). At least some of the alignment pegs 209 of the alignment assembly 200 are preferably soldered to the DUT 201 to ensure a reliable connection. However, any other suitable method of attaching the alignment assembly 200 to the DUT 201 could also be used.

Figure 3D:
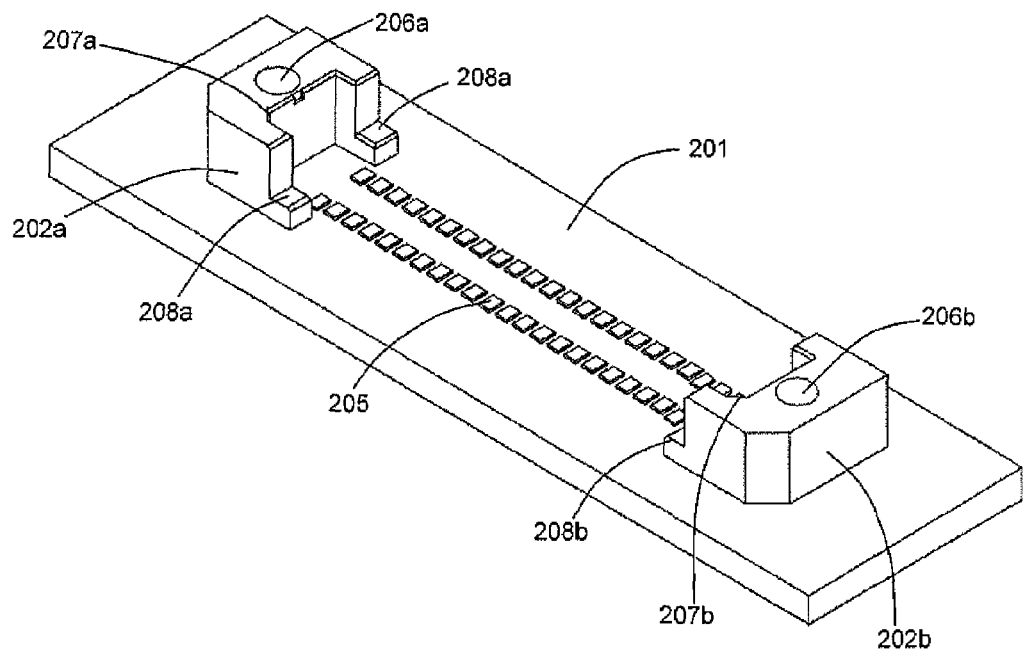

As seen in FIG. 3D, the alignment piece 203 is removed from the alignment assembly 200 to expose the electrical lands 205. This minimizes the area occupied by the alignment features on the surface of the DUT 201.

The alignment blocks 202a and 202b include holes 206a and 206b. Holes 206a and 206b are arranged such that, when the probe 100 (not shown in FIGS. 3A-3D) is inserted between the alignment blocks 202a and 202b, screws 101a and 101b can be screwed into the holes 206a and 206b. This allows the probe 100 to be securely attached to the alignment blocks 202a and 202b, which ensures that the probe 100 has proper contact with the electrical lands 205. It is also possible to use other arrangements to secure the probe 100 to the alignment blocks 202a and 202b. For example, a nut on the bottom of the circuit board, plastic fasteners, or other suitable securing arrangement could be used to secure the probe 100 to the alignment blocks 202a and 202b.

The alignment blocks 202a and 202b also preferably include polarization corners 207a and 207b. The polarization corners 207a and 207b of the alignment blocks 202a and 202b correspond to the polarization corners 107a and 107b of the probe 100. Polarization corners 207a and 207b of the alignment blocks 202a and 202b and the polarization corners 107a and 107b of the probe 100 ensure the proper orientation of the probe 100 with respect to the DUT 201 when the probe 100 is attached to the DUT 201.

Alignment block 202a includes a pair of ledges 208a1 and 208a2, and alignment block 202b includes a pair of ledges 208b1 and 208b2. When the probe 100 is inserted between the alignment blocks 202a and 202b, ledges 208a1, 208a2, 208b1, and 208b2 engage the shroud 112 so that the shroud 112 is retracted as the probe 100 is inserted between the alignment blocks 202a and 202b. The alignment blocks 202a and 202b are arranged such that the distance between ledges 208a1 and 208b1 is smaller than the distance between ledges 208a2 and 208b2. The length of one of the sides of the shroud 112 corresponds to the distance between ledges 208a1 and 208b1, and the length of the other side of the shroud 112 corresponds to the distance between ledges 208a2 and 208b2. This arrangement of the ledges 208a1, 208a2, 208b1, and 208b2 and the shroud 112 ensures the proper orientation of the probe 100 with respect to the DUT 201 when the probe 100 is attached to the DUT 201.

By using the alignment assembly 200 of a preferred embodiment of the present invention, it is possible to secure tight tolerances with respect to the alignment of the probe 100 with the DUT 201 and to minimize the surface area of the DUT 201 that is occupied by the alignment features.

Probe Assembly

Figure 4B:
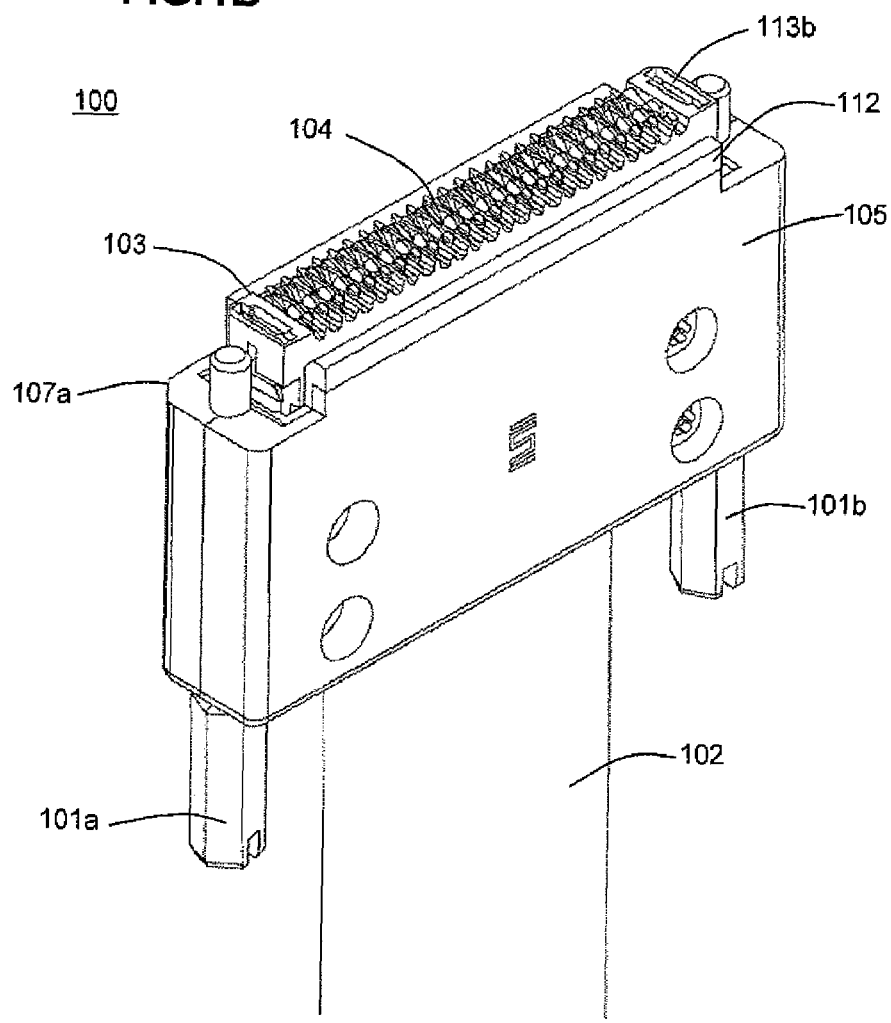
Figure 5A:
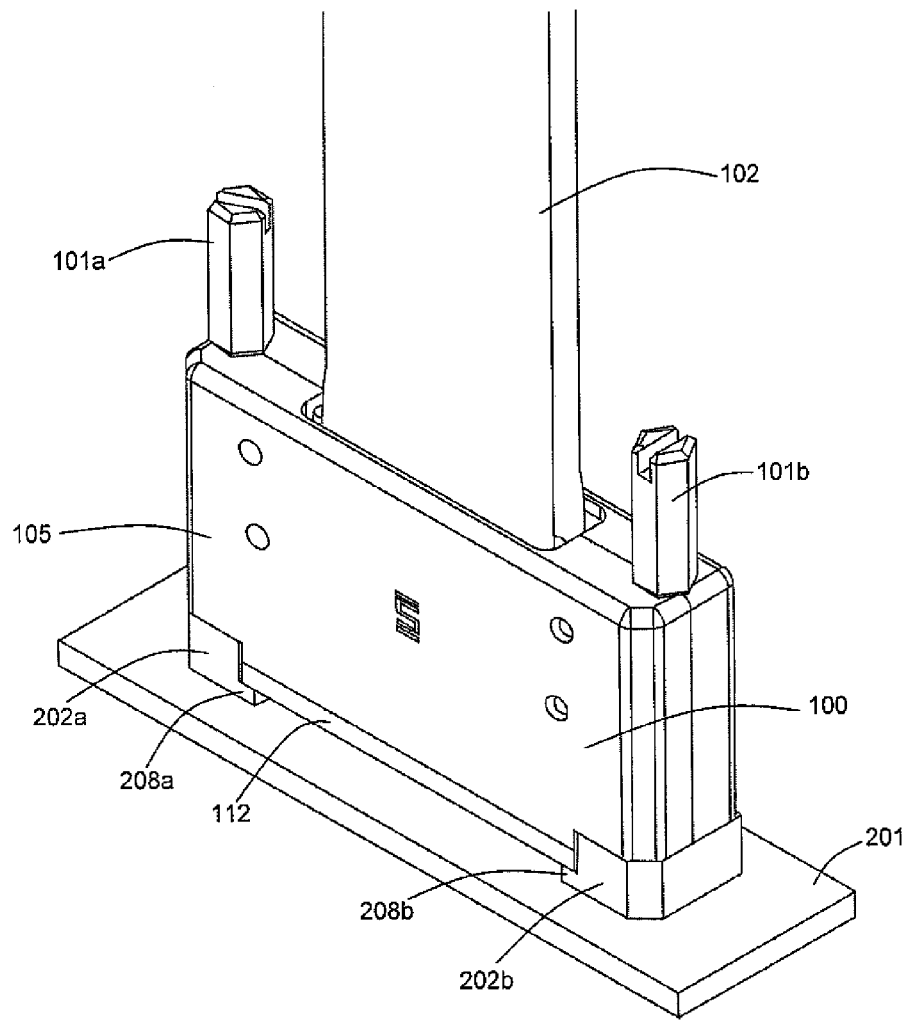
FIGS. 5A and 5B are perspective views of a DUT and a probe according to a preferred embodiment of the present invention.
Figure 5B:
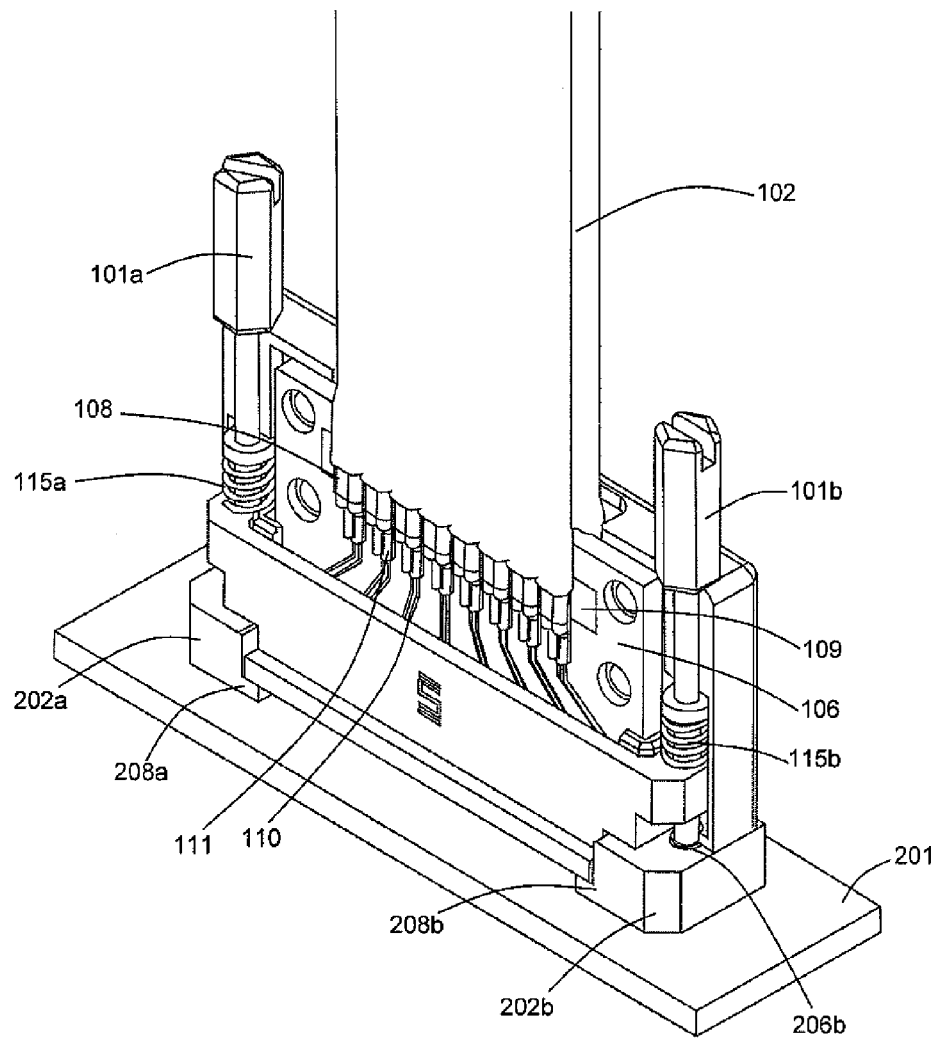
Figure 5C:
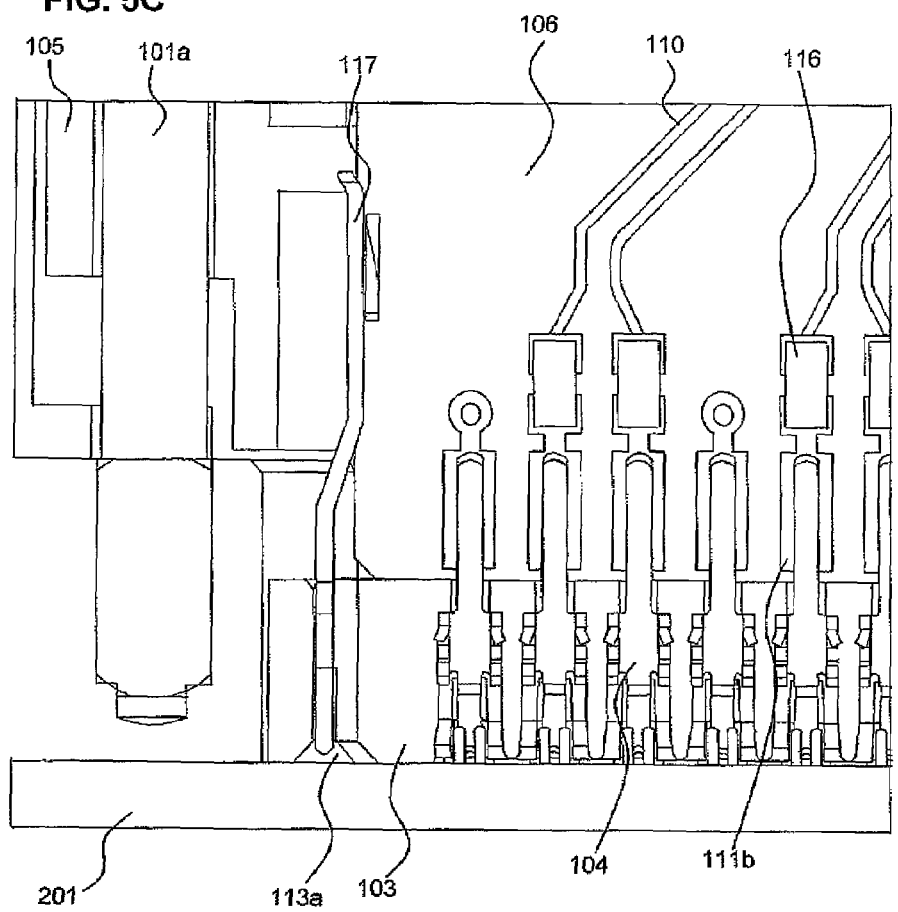
FIG. 5C is a close-up sectional view of a DUT and a probe according to a preferred embodiment of the present invention.

FIGS. 4A and 4B show the probe 100 according to a preferred embodiment of the present invention. FIGS. 5A-5C show the probe 100 mated with the DUT 201. The probe 100 includes probe tip 103, which includes a plurality of contacts 104, and cables 102, which are connected to the contacts 104. The cables 102 connect the contacts 104 to testing equipment (not shown) so that the electrical signals from the DUT 201 are transmitted to the testing equipment. Any type of testing equipment can be used.

Contacts 104 are preferably the contacts 10 discussed above. However, it is possible that other types of contacts could be used. The arrangement of the finger portion 20, the curl portion 30, and the retention portion 40 of the contact 10 allows the probe 100 to have an effective electrical stub length of about 0.100 to about 0.110 inches.

The bifurcated tips of the contacts 104 create redundant current paths for transmitting the electrical signals from the DUT 201, which allows a reliable connection to be formed between the electrical lands 205 of the DUT 201 and the contacts 104.

The contacts 104 are arranged in an array that corresponds to the array of the electrical lands 205 (not shown in FIGS. 4A, 4B, 5A, and 5B). That is, the contacts 104 shown in FIGS. 4A and 4B are preferably arranged in two rows. However, as with the electrical lands 205, the contacts 104 can be arranged in a different array. For example, the contacts 104 can be arranged in one row or in three or more rows.

The probe 100 includes a housing 105. As shown in FIG. 5B, the housing 105 encloses a circuit board 106, a portion of the screws 101a and 101b, a portion of the probe tip 103, and a portion of the cables 102. The cables 102 are terminated to both sides of the circuit board 106. Each side of the circuit board 106 includes traces 110 that connect a pair of electrical lands 111a and 111b (electrical lands 111a are shown in FIG. 5B and electrical lands 111b are shown in FIG. 5C). Each of the cables 102 is connected to an electrical land 111a, which is connected to a corresponding electrical land 111b on the circuit board 106 by one of the traces 110.

The corresponding electrical land 111b is connected to the finger portion of the contact 104 in a manner similar to that shown in FIG. 2. That is, the circuit board 106 is inserted between the two rows of contacts 104 in the probe tip 103 so that the finger portions of the contacts 104 of the opposing rows contact the corresponding electrical land 111b on opposite sides of the circuit board 106 (only one side of the circuit board is shown). With this arrangement of contacts 104, half of the probe tip 103 is an edgemount connector (the half that engages the circuit board 106), and half of the probe tip 103 is a compression connector (the half that engages the DUT 201). That is, the probe tip 103 is a replaceable compression connector, in which the edgemount half of the probe tip 103 allows the probe tip 103 to be replaceable.

Although each of the cables 102 is connected to a corresponding contact 104, each contact 104 is not necessarily connected to a cable 102. Some of the contacts 104 are connected to a ground plane in the circuit board. It is preferable that the cables 102 are grouped into pairs of differential signals. However, it is not required that the cables 102 be grouped in pairs of differential signals. For example, all of the cables 102 can be single-ended signals, or some of the cables 102 can be grouped in pairs of differential signals and some of the cables 102 can be single-ended signals. When some or all of the cables 102 are grouped into pairs of differential signals, it is preferable that the contacts 104, which are between adjacent pairs of contacts 104 connected to the cables 102 with the differential signals, are connected to the ground plane in the circuit board 106. However, any other arrangement of contacts 104 connected to the ground plane can also be used. For example, it is also possible to connect all of the contacts 104 to a corresponding cable 102 so that none of the contacts 104 is connected to the ground plane in the circuit board 106.

It is preferable, as shown in FIG. 5C, to shorten the electrical stub length of the probe 100 by providing a resistor 116 in the path of the trace 110. By placing the resistor 116 as close as possible to the electrical land of the circuit board 106 directly connected to the contacts 104, the effective electrical stub length can be shortened as much as possible. It is also possible to add other elements, both active and passive, to the circuit board 106 to alter the electrical characteristics, including the effective electrical stub length, of the probe 100.

The cables 102 are typically soldered to the circuit board 106 to ensure a reliable connection. The cables 102 can be attached to the circuit board 106 by any other suitable method. The cables 102 shown in FIG. 5B preferably include a ground sheath 108 that is soldered to ground pad 109. It is possible to use cables that do not have a ground sheath. However, the ground sheath 108 reduces the cross-talk of the cables 102.

The housing 105 of the probe 100 includes a shroud 112 that is retractable. As discussed above, the length of one of the sides of the shroud 112 corresponds to the distance between ledges 208a1 and 208b1, and the length of the other side of the shroud 112 corresponds to the distance between ledges 208a2 and 208b2. The shroud 112 protects the probe tip 103. Because of the shroud 112, it is not necessary to provide the probe 100 with a cap to cover the probe tip 103. FIG. 4A shows the shroud 112 when it is not retracted, and FIG. 4B shows the shroud 112 when it is retracted. The shroud 112 is forced away from the probe 100 by the springs 115a and 115b, as shown in the FIG. 5B, so that the shroud 112 protects the probe tip 103 when the probe 100 is not attached to the DUT 201. As discussed above, when the probe 100 is inserted between the alignment blocks 202a and 202b, the ledges 208a and 208b of the alignment blocks 202a and 202b engage with the shroud 112 to push the shroud 112 into the housing 105 as the probe 100 is screwed into the alignment blocks 202a and 202b.

The probe tip 103 is field-replaceable. That is, the probe tip 103 can be easily replaced by the end-user of the probe 100 and does not need to be sent back to the manufacturer, or repair facility, to desolder or cut the probe tip 103 to replace the probe tip 103. The probe tip 103 can be replaced when the probe tip 103 is defective, damaged, or malfunctioning. It is also possible to provide probe tips 103 with different electrical properties so that it is also possible to replace the probe tip 103 when a probe tip 103 having different electrical properties is desired. The replaceability of the probe tip 103 greatly increases the life of the probe 100 because the probe tip 103 is the most likely part of the probe 100 to fail. The probe tip 103 is the most likely part of the probe 100 to fail because of the probe tip's 103 repeated engagement with a DUT. Even though the probe tip 103 is replaceable, the profile of the probe 100 does not extend outside of the footprint defined by the alignment blocks 202a and 202b and by the array of electrical lands 205, which allows an end-user to easily insert the probe 100 between the alignment blocks 202a and 202b when testing the DUT 201. Further, this compact design of the probe 100 allows the probes 100 to be side and end stackable.

The probe tip 103 is kept in place by the frictional forces between the finger portions of the contacts 104 and the electrical lands 111b of the circuit board 106 and the locking clip 117. It is possible to also use other similar devices to securely attach the probe tip 103 to the circuit board 106. However, the other similar device would have to be disengageable from the circuit board 106 by the tool 120, discussed below, to allow the probe tip 103 to be removed from the probe 100. It is also possible to use only the frictional forces between the finger portions of the contacts 104 and the electrical lands 111b of the circuit board 106 and to omit the use of the locking clip 117.

Figure 6A:
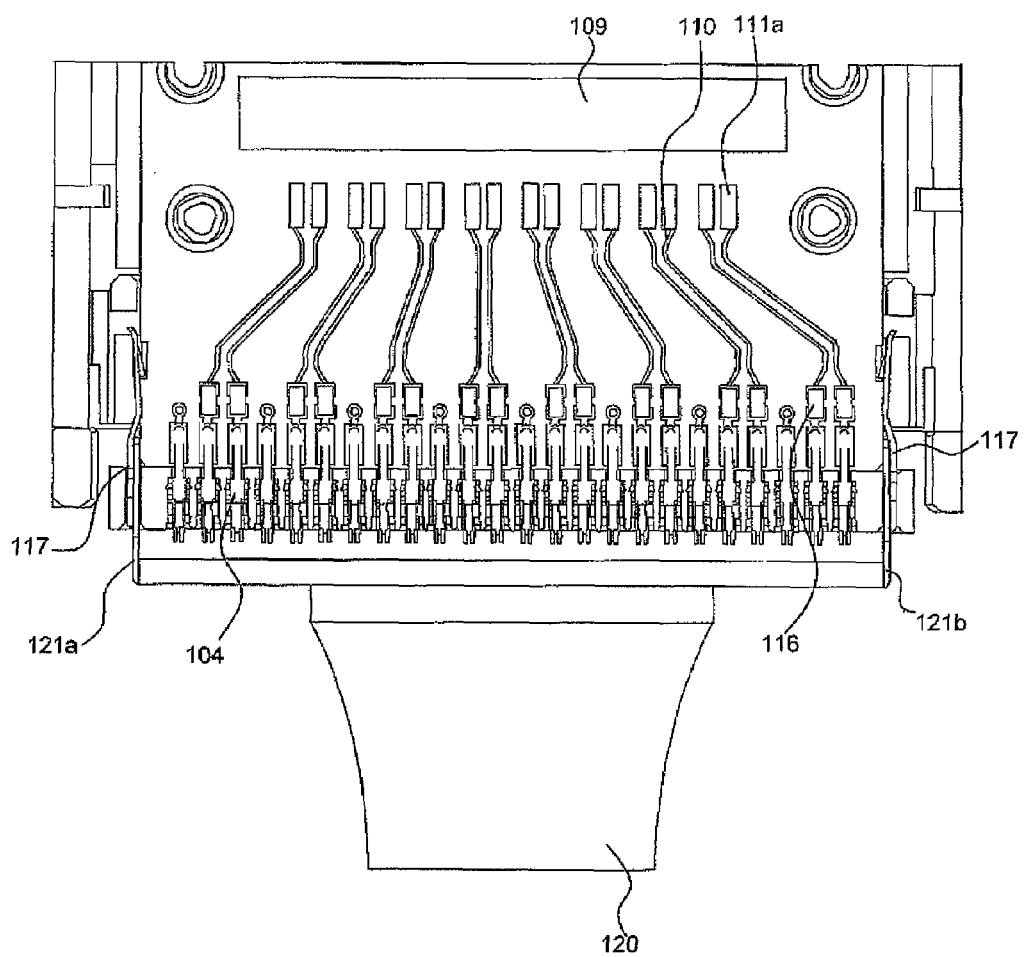
FIGS. 6A-6C show a probe tip according to a preferred embodiment of the present invention being removed from a probe according to a preferred embodiment of the present invention.
Figure 6B:
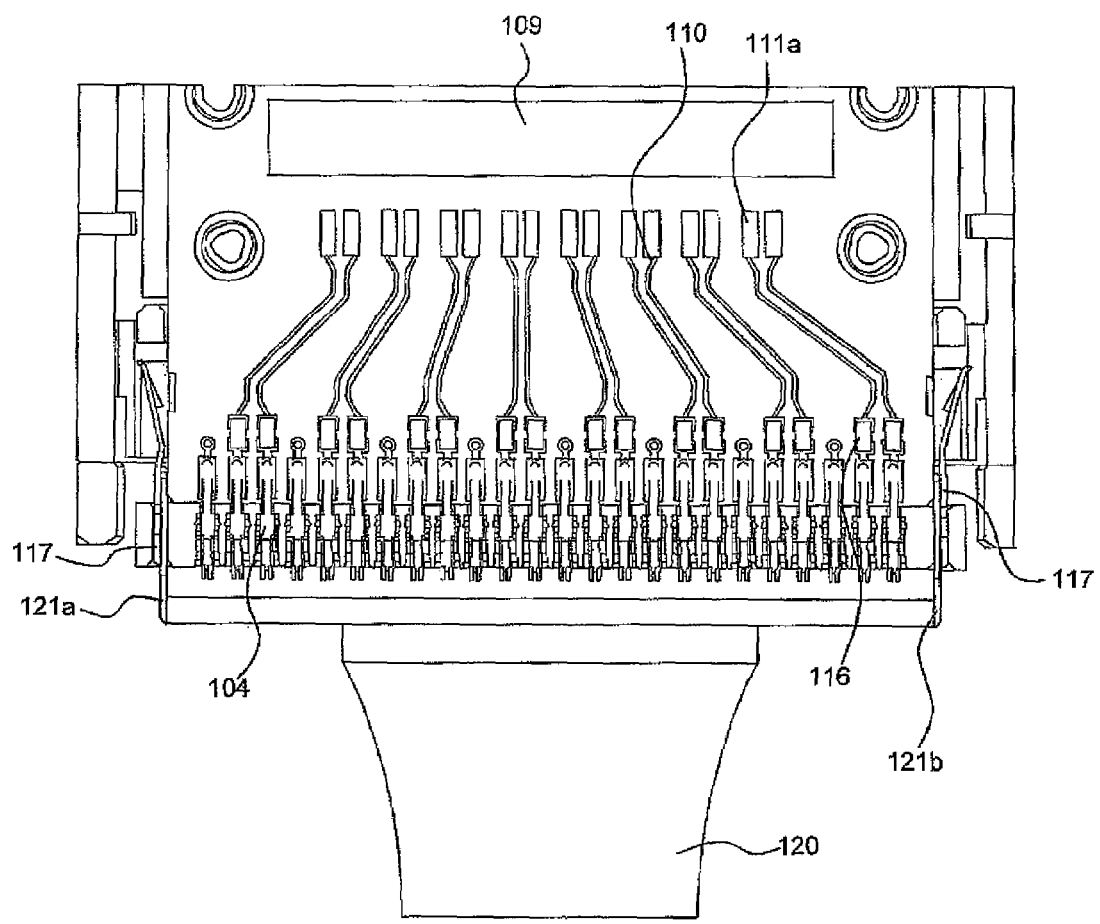
Figure 6C:
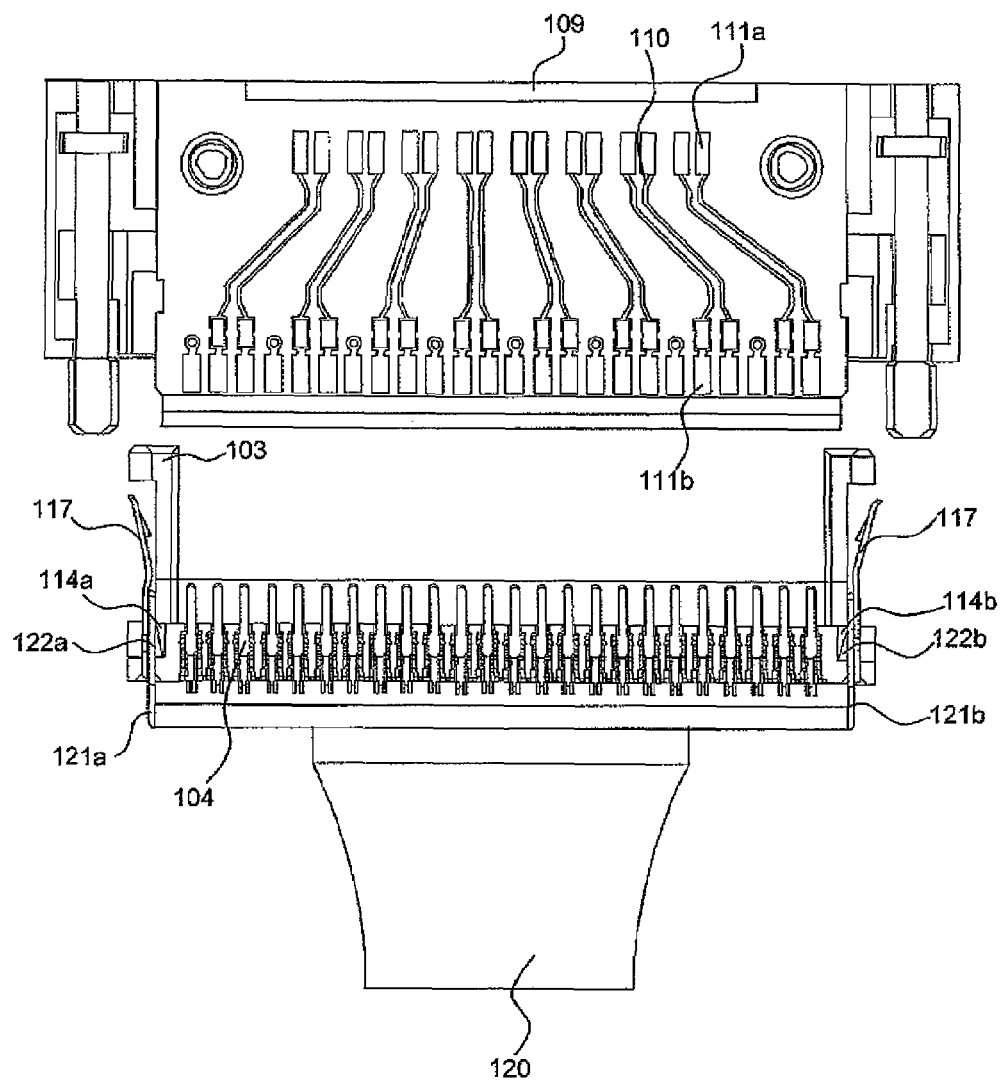

As shown in FIGS. 6A-6C, the probe tip 103 is removed from the housing 105 by inserting the prongs 121a and 121b of the tool 120 into the slots 113a and 113b in the probe tip 103. Each of the prongs 121a and 121b includes a lance 122a and 122b that extends away from the prongs 121a and 121b. As the prongs 121a and 121b are inserted in the slots 113a and 113b, the lances 122a and 122b are forced by the regions of the probe tip 103 near the slots 113a and 113b toward the prongs 121a and 121b. When the prongs 121a and 121b are fully inserted into the slots 113a and 113b, the lances 122a and 122b once again extend away from the prongs 121a and 121b and into the notches 114a and 114b of the probe tip 103.

When the tool 120 is pulled away from the probe 100, the lances 122a and 122b engage the probe tip 103, which pulls the probe tip 103 from the probe 100 as the tool 120 is pulled away from the probe 100. Because the prongs 121a and 121b apply the same force to both sides of the probe tip 103, uneven probe tip 103 removal ("zippering") is prevented, which can damage both the probe tip 103 and the circuit board 106.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A probe for testing the electrical characteristics of a device to be tested comprising:
   a housing;
   a plurality of cables;
   a circuit board located within the housing and having a first plurality of electrical lands arranged on a first surface of the circuit board and a second plurality of electrical lands arranged on a second surface of the circuit board; and
   a field-replaceable probe tip having a plurality of contacts; wherein
   each of the plurality of cables is connected to a corresponding one of the plurality of lands;
   each of a first group contacts of the plurality of contacts includes:
      a first end that is directly connected to a corresponding one of the first plurality of electrical lands; and
      a second end that is arranged to engage with a surface of the device to be tested that is perpendicular or substantially perpendicular to the first surface of the circuit board; and
   each of a second group contacts of the plurality of contacts includes:
      a first end that is directly connected to a corresponding one of the second plurality of electrical lands; and
      a second end that is arranged to engage with a surface of the device to be tested that is perpendicular or substantially perpendicular to the first surface of the circuit board.

2. A probe according to claim 1, further comprising a retractable shroud arranged to retract as the probe is connected to the device to be tested.

3. A probe according to claim 1, wherein at least one of the plurality of contacts has a bifurcated tip.

4. A probe according to claim 1, wherein at least one of the plurality of contacts includes a finger portion, a retention portion, and a curl portion.

5. A probe according to claim 4, wherein the finger portion is the first end of the at least one of the plurality of contacts.

6. A probe according to claim 4, wherein the curl portion is the second end of the at least one of the plurality of contacts.

7. A probe according to claim 1, wherein the plurality of contacts are arranged such that the field-replaceable probe tip includes a compression connector arranged to engage the device to be tested.

8. A probe according to claim 1, wherein the plurality of contacts are arranged such that the field-replaceable probe tip includes an edgemount connector that is field-replaceable with the circuit board.

9. A probe according to claim 1, wherein some of the contacts are connected to a ground plane.

10. A probe according to claim 1, wherein at least some of the plurality of cables are grouped in pairs of cables that transmit differential signals.

11. A probe according to claim 1, wherein an effective electrical stub length of the probe is about 0.100 inches to about 0.110 inches.

12. A probe according to claim 1, wherein the housing includes at least one corner that is arranged such that the proper orientation of the probe with respect to the device being tested is ensured when the device to be tested is tested.

13. A probe according to claim 1, wherein the field-replaceable probe tip includes a pair of slots and a pair of notches; and
the pair of slots and the pair of notches are arranged such that a tool can be used to remove the field-replaceable probe tip from the probe by being inserted into the pair of slots and by engaging the pair of notches when the tool is pulled away from the probe.

14. A probe according to claim 1, wherein at least one spring in the housing pushes a retractable shroud away from the probe to protect the field-replaceable probe tip when the probe is not testing the device to be tested.

15. A probe assembly comprising:
the probe according to claim 1; and
a device to be tested.

* * * * *